United States Patent
Yang et al.

(10) Patent No.: US 9,123,612 B2
(45) Date of Patent: Sep. 1, 2015

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Jer-Shien Yang, Hsinchu (TW); Huei-Ju Yu, Hsinchu (TW); I-Ling Kuo, Taipei (TW); Wen-Lung Ho, Hsinchu County (TW); Chunyuan Chao, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/068,528

(22) Filed: Oct. 31, 2013

(65) Prior Publication Data

US 2015/0115337 A1 Apr. 30, 2015

(51) Int. Cl.
*H01L 21/76* (2006.01)
*H01L 27/146* (2006.01)

(52) U.S. Cl.
CPC ...... *H01L 27/14643* (2013.01); *H01L 27/1463* (2013.01); *H01L 27/14689* (2013.01)

(58) Field of Classification Search
CPC ............. H01L 21/76224; H01L 21/76229; H01L 21/823878; H01L 21/0254; H01L 21/02458; H01L 29/2003; H01L 23/53295; H01L 21/3185; H01L 33/007; H01L 33/0075; H01L 27/1463; H01L 2924/05042
USPC ........................................... 438/427; 257/292
See application file for complete search history.

(56) References Cited

U.S. PATENT DOCUMENTS

| | | | | |
|---|---|---|---|---|
| 6,184,101 | B1 * | 2/2001 | Tsuzuki | 438/361 |
| 2005/0280015 | A1 * | 12/2005 | Taniguchi et al. | 257/98 |
| 2006/0043455 | A1 * | 3/2006 | Batra et al. | 257/314 |
| 2006/0292793 | A1 * | 12/2006 | Sandhu et al. | 438/257 |
| 2007/0194356 | A1 * | 8/2007 | Moon et al. | 257/291 |
| 2009/0256226 | A1 * | 10/2009 | Tatani et al. | 257/432 |
| 2010/0093173 | A1 * | 4/2010 | Park et al. | 438/689 |

* cited by examiner

*Primary Examiner* — Wael Fahmy
*Assistant Examiner* — Sarah Salerno
(74) *Attorney, Agent, or Firm* — WPAT, P.C.; Anthony King (57) ABSTRACT

A semiconductor structure includes a substrate, an imaging pixel array disposed on a first region of the substrate, a first isolation disposed in the first region, a periphery circuitry disposed on a second region of the substrate, and a second isolation disposed in the second region. The imaging pixel array has a plurality of imaging pixels configured to capture image data. The periphery circuitry has a transistor configured to receive and process the image data. The first isolation has a first depth and a first protrusion projected from a surface of the substrate. The second isolation has a second depth and a second protrusion projected from the surface of the substrate. The first protrusion has a substantially same height as the second protrusion. The first depth is different from the second depth.

12 Claims, 11 Drawing Sheets

SEMICONDUCTOR STRUCTURE AND MANUFACTURING METHOD THEREOF

FIELD

The present disclosure relates to a semiconductor image sensor.

BACKGROUND

Semiconductor image sensors are used to sense radiation, such as lights. Complementary metal-oxide-semiconductor (CMOS) image sensors (CIS) are widely used in various applications, such as digital cameras or mobile phone cameras. These devices utilize an array of pixels located in a substrate, including photodiodes and transistors that can absorb radiation projected toward the substrate, and convert the sensed radiation into electrical signals.

Typically, an image sensor includes a pixel region and a periphery region. The pixel region includes a plurality of pixels. The periphery region includes circuits. Isolations for each region are required. However, different devices need different depths of trenches. A conventional dual shallow trench isolation (STI) process presents a problem in that an STI oxide step height is different between the pixel region and the periphery region. The oxide step height causes profiles of polysilicon related items to not match between the pixel region and the periphery region. Non-matching of the polysilicon related items results in poor electrical properties.

In modern semiconductor fabrication, it is common to have several regions with different isolation pattern densities in a die. However, different isolation pattern density results in severe micro loading effects. As such, the micro loading effects may cause an isolation step height difference between an isolated region and a dense region. The oxide step height causes profiles of polysilicon related items to not match between the isolated region and the dense region.

BRIEF DESCRIPTION OF THE DRAWINGS

Aspects of the present disclosure are described with reference to the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

The making and using of various embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An "image pixel", as used herein, refers to a device used to capture photons, and generate electrical signals from the received photons. In some embodiments, the image pixel includes a photodiode, a transfer transistor, a floating diffusion region, a reset transistor, a source follower (common drain amplifier), and a select transistor, which is typically called a 4-T image sensor. It should be appreciated that embodiments of the present disclosure are not limited to 4-T image pixel architectures; rather, one of ordinary skill in the art having the benefit of the instant disclosure will understand that the present disclosure is also applicable to 3T designs, 5T designs, and various other image pixel architectures. During operation, incident light is received by the photodiode. Electron-hole pairs are generated in response to the received light. The electrons are then collected in the photodiode, and transferred to the floating diffusion region by way of the transfer transistor. Later, the electrons are converted into electrical signals to be received. The reset transistor is coupled between a power VDD and the floating diffusion region so as to reset the floating diffusion region to a preset voltage. The floating diffusion region is coupled to control the gate of the source follower. The source follower is coupled between the power VDD and the select transistor. The source follower is configured to provide an infinite input resistance reduced to a small output resistance. The source follower is typically used as a voltage buffer. Such resistance reduction provides combination for a more ideal voltage source. Finally, the select transistor selectively couples the output of the image pixel to a readout column line or a readout row line.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI). In an image sensor, the isolation is disposed between imaging pixels and adjacent imaging pixels so as to isolate the adjacent imaging pixels. In addition, the isolation is configured to act as a barrier to keep charge carriers (holes or electrons) from penetrating into an adjacent imaging pixel.

The term "periphery circuitry," as used herein, refers to a circuitry that is not physically located within an image pixel array. Instead, the circuitry locates a periphery of a semiconductor die. The periphery circuitry includes a control circuitry coupled with the image pixels to control operations of the image pixels. In addition, the periphery circuitry includes a readout circuitry coupled with outputs of each image pixels. The readout circuitry and the control circuitry respectively include a sampling circuitry, an amplification circuitry, operational amplifiers, capacitors, diodes, analog to digital convertors, transistors, or other devices. For example, after the reset transistor receives a reset signal, the floating diffusion region is applied to a predetermined voltage. Later, after electrons transfer to the floating diffusion region and are amplified by the source follower, an image data is read out from the floating diffusion region by the readout circuitry in the peripheral circuitry. The readout circuitry stores the image data or even manipulates the image data. In some embodiment, the readout circuitry read out a row of image data at a time or reads out the image data using a variety of other techniques.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

Figure 1:
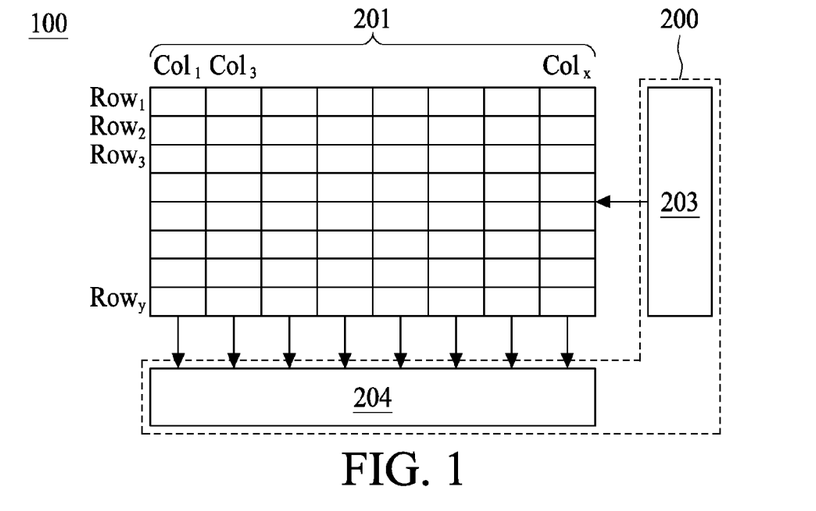
FIG. 1 is a functional block diagram illustrating an imaging system, in accordance with some embodiments of the present disclosure.

In reference to the Figures, FIG. 1 is a functional block diagram illustrating a semiconductor structure, such as an imaging system 100, in accordance with some embodiments of the present disclosure. The image system 100 includes a pixel array 201 and a periphery circuitry 200. In addition, the periphery circuitry 200 includes a control circuit 203 and a readout circuit 204. In some embodiments, the periphery circuitry 200 is physically surrounding the pixel array 201. Accordingly, the periphery circuitry 200 is located on a periphery of a semiconductor die where an integrated circuit for readout and processing is fabricated. The imaging system 100 is implemented as a back or front-illuminated Complementary Metal Oxide Semiconductor (CMOS) image sensor in some embodiments in accordance with the disclosure. Thus, the periphery circuitry 200 is implemented as standard CMOS electronic circuits that are electrically connected to the pixel array 201.

The pixel array 201 includes a plurality of image pixels arranged in a predetermined number of columns and rows. As illustrated, each image pixel is arranged into a row (e.g., Row$_1$ to Row$_y$) and a column (e.g., Col$_1$ to Col$_x$) to capture image data. The control circuit 203 selects appropriate row or column lines for pixel readout. The row lines are selectively activated by the control circuit 203 and the column lines are selectively activated by the readout circuit 204. The control circuit 203 and the readout circuit 204 apply a driving voltage to drive transistors of the selected row and column lines. Thus, the control circuit 203 and the readout circuit 204 cooperatively access the image data of each image pixel. In some embodiment, the readout circuit 204 includes an analog to digital converter and an image processor. The analog to digital converter converts analog pixel signals received from the pixel array 201 into digital signals. Accordingly, the digital signals transmit to the image processor to form a digital image.

Figure 2:
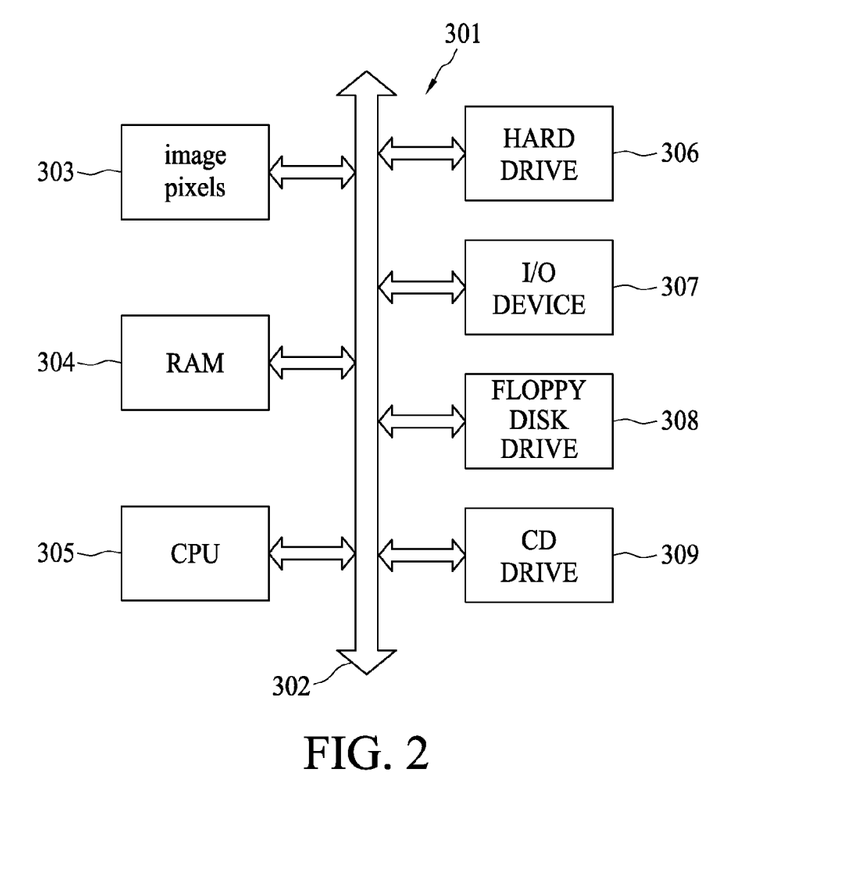
FIG. 2 is a schematic diagram of a processing system which employs the imaging system having a pixel array, in accordance with some embodiments of the present disclosure.

FIG. 2 is a schematic diagram of a processing system 301 which employs the imaging system 100 having the pixel array 201 with reference to FIG. 1, in accordance with some embodiments of the present disclosure. The processing system 301 includes a bus 302, image pixels 303, a random access memory (RAM) 304, a central processing unit (CPU) 305, a hard drive 306, an input/output (I/O) device 307, a floppy disk drive 308, and a compact disk (CD) drive 309. Those above devices communicate with each other through the bus 302.

Some of the devices provide communication into and out of the processing system 301. For example, the input/output (I/O) device 307 and the image pixels 303 are such communication devices. Some of the devices provide temporary data storage and drivers such as the random access memory (RAM) 304, the hard drive 306, the floppy disk drive 308, and the compact disk (CD) drive 309. Some of the devices provide functions of computing and image processing, for example, the central processing unit (CPU) 305.

In some embodiments, an image data is read out from the image pixels 303. The image data is temporarily stored in the random access memory (RAM) 304. Later, the image data transfers to the central processing unit (CPU) 305 for assembling an original image. Accordingly, the original image outputs to the input/output (I/O) device 307. Examples of processor based systems, which may employ the image pixels 303 and the processing system 301, include, without limitation, computer systems, camera systems, scanners, machine vision systems, vehicle navigation systems, video telephones, surveillance systems, auto focus systems, star tracker systems, motion detection systems, image stabilization systems, and others.

Figure 3:
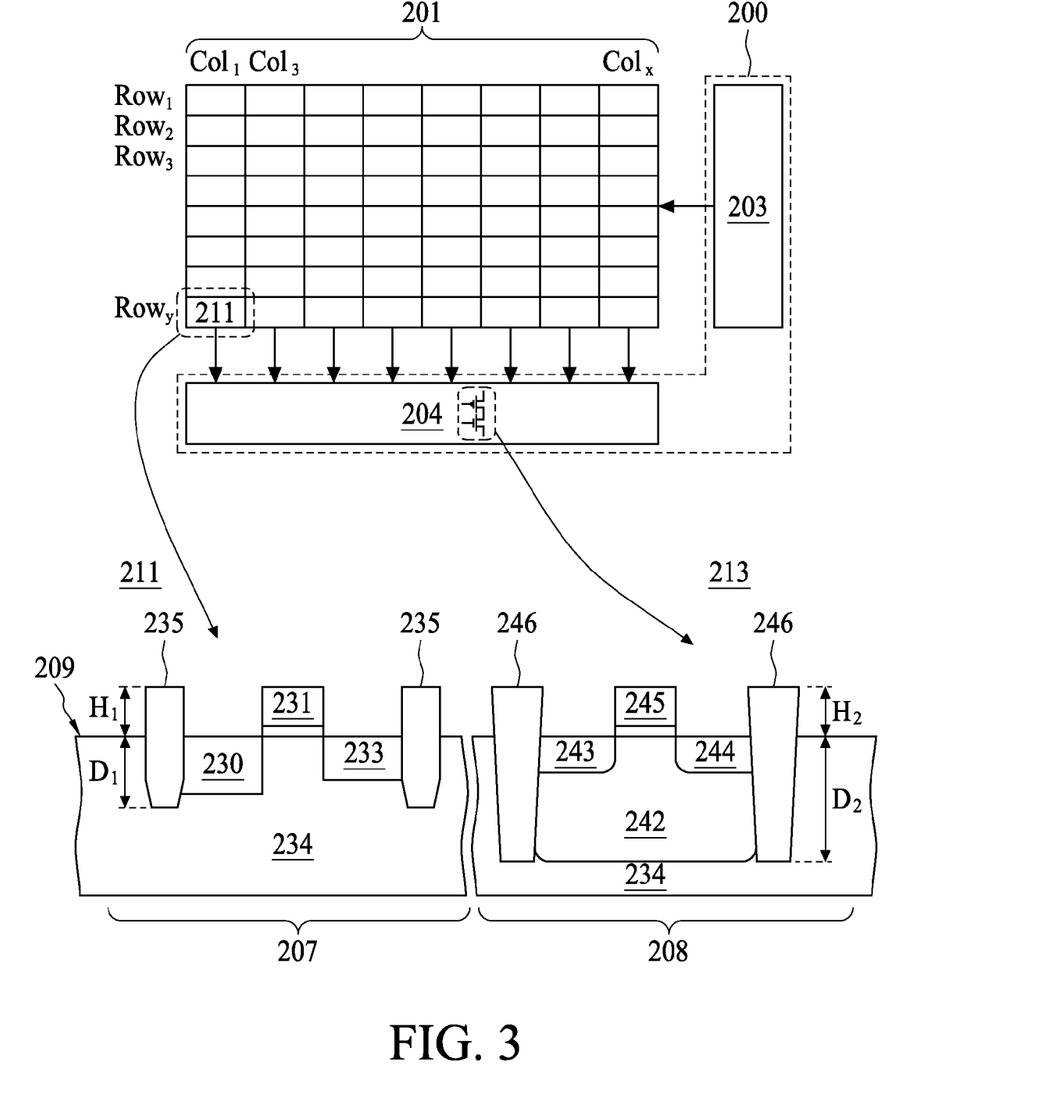
FIG. 3 is a zoom-in schematic diagram of FIG. 1, in accordance with some embodiments of the present disclosure.

FIG. 3 is a zoom-in schematic diagram of FIG. 1, in accordance with some embodiments of the present disclosure. As referred to FIG. 3, the pixel array 201 includes a first pixel 211. The zoom-in schematic diagram of the first pixel 211 is shown in the bottom of FIG. 3. The first pixel 211 disposed on a substrate 234 includes a photodiode 230 (or a pinned diode), a transfer gate 231, and a floating diffusion region 233. Isolations 235 are disposed adjacent to the first pixel 211. The first pixel 211 is disposed on a pixel region 207 of the substrate 234.

Since the pixel array 201 captures image data and the periphery circuitry 200 receives and processes the image data, the pixel array 201 and the periphery circuitry 200 are both formed on the substrate 234. There are image pixels formed in the pixel array 201, whereas there are complementary metal oxide semiconductors formed in the periphery circuitry 200. Different devices require different depths of isolations. Thus, in the process for forming different depths of isolations, performing an etching process at least twice is required for deeper trenches in an isolation process. However, the extra etching process results in a different thickness of a nitride film between the pixel region 207 and the periphery region 208. The different thickness of the nitride film induces a different isolation height between the pixel region 207 and the periphery region 208. This causes a problem of mismatch of polysilicon related items between the pixel region 207 and the periphery region 208. For example, during a gate formation between isolations, a polysilicon layer is deposited over intervals of the isolations. The polysilicon layer is then patterned and etched to form a poly-gate. During an etching process, a path of ions of etching gas is influenced by protrusion heights. Accordingly, different protrusion heights in these two regions cause deformation of the poly-gate profile even with a same pattern. The profile of the poly-gate is changed in comparison to a predetermined pattern. The deformation causes mismatch of electrical properties between the pixel region 207 and the periphery region 208, such as threshold voltage mismatch, capacitance mismatch, and saturation current mismatch.

In some embodiments, the substrate 234 can be implemented as an epitaxial substrate having an n conductivity type or a p conductivity type. The photodiode 230 is implemented as a pinned photodiode or a p-n junction disposed in the substrate 234. The photodiode 230 receives a light beam from an image. The light beam induces the photodiode 230 to generate electron-hole pairs in a depletion region of the photodiode 230. The transfer gate 231 is disposed laterally adjacent to the photodiode 230. The transfer gate 231 is typically implemented as a control gate having a metal gate structure or a polysilicon structure. The electrons in the photodiode 230 transfer to the floating diffusion region 233 under the control of the transfer gate 231. The floating diffusion region 233 serves as a region configured for transforming the electrons into a corresponding voltage. The floating diffusion region 233 is disposed laterally adjacent to the transfer gate 231. Accordingly, the transfer gate 231 is disposed between the photodiode 230 and the floating diffusion region.

In some embodiments, the isolations 235 are disposed adjacent to an image pixel. Two of the isolations 235 sandwich an image pixel or a group of image pixels. The isolations 235 are disposed in the pixel region 207. With regard to each of the isolations 235, a portion of an isolation is formed inside the substrate 234. Another portion of the isolation projects from a surface 209 of the substrate 234 to form a protrusion. Each of the isolations 235 in the pixel region 207 has a first depth D1 and a first protrusion height H1 projected from the surface 209 of the substrate 234. In some embodiments, some isolations 235 further include different depths since the photodiode 230 and the floating diffusion region 233 require conductive wells with different depths. Although the isolations 235 include different depths in the pixel region 207, each of the isolations 235 has substantially the same height as the first protrusion height H1.

As referred to in FIG. 3, the control circuit 203 and the readout circuit 204 include a plurality of transistors. A transistor 213 is disposed in the readout circuit 204. The zoom-in schematic diagram of the transistor 213 is shown in the bottom right of FIG. 3. The transistor 213 disposed on the substrate 234 includes a well 242, a source 243, a drain 244, and a gate 245. Isolations 246 are disposed adjacent to the transistor 213. The transistor 213 is disposed on a periphery region 208 of the substrate 234. The transistor 213 can be implemented as a p type transistor or an n type transistor. A person with skill in the art may realize the detailed operation and structure of the transistor 213.

In some embodiments, two of the isolations 246 sandwich a transistor or a group of transistors. With regard to each of the isolations 246, a portion of an isolation is formed inside the substrate 234. Another portion of the isolation projects from the surface 209 of the substrate 234 to form a protrusion. Each of the isolations 246 in the periphery region 208 has a second depth D2 and a second protrusion height H2 projected from the surface 209 of the substrate 234. In some embodiments, some of the isolations 246 in the periphery region 208 further include different depths since the well 242 requires different depths for specific purposes. Although the isolations 246 include different depths in the periphery region 208, each of the isolations 246 has substantially the same height as the second protrusion height H2.

In some embodiments, the first depth D1 of the isolations 235 in the pixel region 207 is different from the second depth D2 of the isolations 246 in the periphery region 208. For example, a difference between the first depth D1 and the second depth D2 is between about 0.05 µm and 0.4 µm. Despite having different depths between the pixel region 207 and the periphery region 208, the first protrusion height H1 is substantially the same as the second protrusion height H2. It should be noted that because of some minor process deviations, there is a slightly difference between H1 and H2. However, H1 and H2 are still considered to have substantially the same height because the difference is not significant with respect to the depth of isolation. In some embodiments, there is about 5% to about 10% difference between H1 and H2. In some embodiments, the difference between H1 and H2 can be ignored in view of the first or second depth. For example, the first depth D1 is about 3000 angstroms and the second depth is about 4200 angstroms. A difference between H1 and H2 is about 100 angstroms. In some embodiments, a difference between H1 and H2 is between about 300 angstroms and 400 angstroms.

According to some embodiments, an advantage of the present disclosure is to eliminate a micro loading effect during an etching process. In some shallow trench isolation (STI) etching processes, micro loading effect is severe because of different pattern density. The micro loading effect results from the difference in an etch rate between a region with dense trench pattern and a region with isolated pattern on a substrate. In the STI etching processes, for example, silicon substrate is etched at a significantly higher rate in the dense pattern region than in the isolated region. The difference in etching rates between these two areas results in the micro loading effect.

Figure 4:
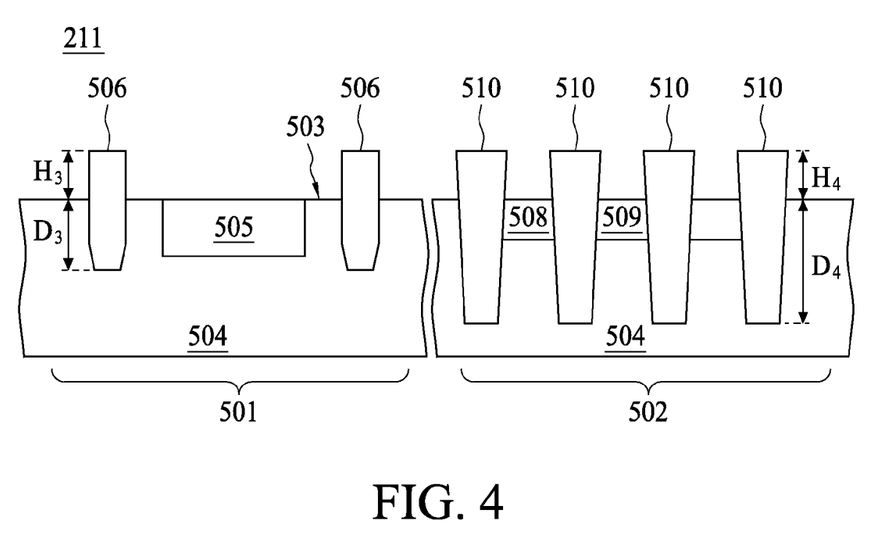
FIG. 4 is a cross section view of an isolated and a dense region, in accordance with some embodiments of the present disclosure.

FIG. 4 is a cross section view of an isolated region 501 and a dense region 502, in accordance with some embodiments of the present disclosure. The isolated region 501 of a substrate 504 has a first isolation pattern density, which is lower than a second isolation pattern density of the dense region 502. Isolations 506 are in the isolated region 501 of the substrate 504. An active region 505 in the substrate 504 is between two isolations 506. The active region 505 represents a site where a device or a group of devices will eventually be formed. The active region 505 may include a transistor, an image pixel, a capacitor, a diode, or a resistance, etc. Isolations 510 are in the dense region 502 and there are several active regions such as 508 and 509 are interposed between the isolations 510.

Each isolation 506 in the isolated region 501 has a third depth D3 and a third protrusion height H3 projected from surface 503 of the substrate 504. Each isolation 510 in the dense region 502 has a fourth depth D4 and a fourth protrusion height H4 projected from the surface 503. The difference between D3 and D4 is because micro loading effect during a trench forming operation, which will be described later in a different part of the present disclosure. In some embodiments, the third protrusion height H3 is substantially the same as the fourth protrusion height H4. It should be noted that because of some minor process deviations, there is a slightly difference between H3 and H4. However, H3 and H4 are still considered to have substantially height since the difference is not significant with respect to the depth of isolation. In some embodiments, there is about 5% to about 10% difference between H3 and H4. In some embodiments, the difference between H3 and H4 can be ignored in view of the third or fourth depth. For example, the third depth D3 is about 4000 angstroms and the fourth depth D4 is about 4500 angstroms. A difference between H3 and H4 is about 100 angstrom. In some embodiments, a difference between H3 and H4 is between about 300 angstroms and 400 angstroms.

FIGS. 5A-5K represent a method of manufacturing an image system 100 as in FIG. 1 in accordance with some embodiments of the present disclosure. Each figure represents a stage of the method in a cross sectional perspective view.

Figure 5A:
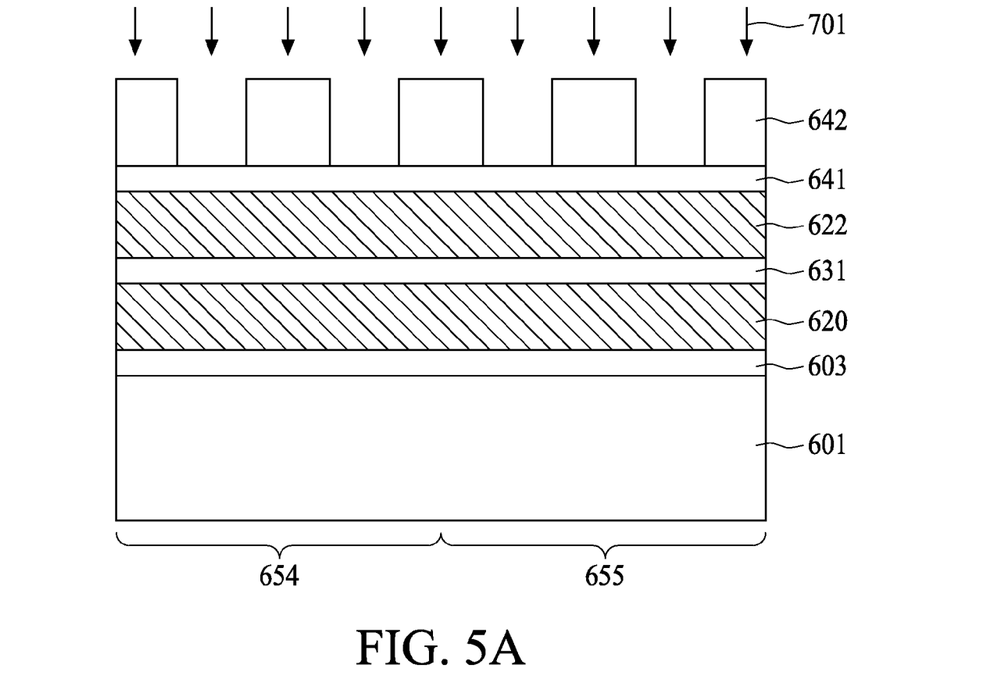
FIGS. 5A-5K represent a method of manufacturing isolations, in accordance with some embodiments of the present disclosure.

Referring to FIG. 5A, a pad layer 603 is formed over a substrate 601. The substrate 601, for example, is a silicon substrate, an epitaxial layer, or a SOI substrate. The pad layer 603, for example, is an oxide layer which is thermally grown or deposited by CVD or PVD. The pad layer 603 primarily serves as a stress buffer layer between the substrate 601 and a first silicon nitride layer 602. The first nitride layer 620 is formed over the pad layer 603 by deposition. In some embodiments, the first nitride layer 620 includes silicon nitride and serves as a stop layer for chemical mechanical polishing in a subsequent process. In some embodiments, the first nitride layer 620 serves as a mask layer for a subsequent oxide growth process. A stop layer 631 is formed over the first nitride layer 620. (thickness range from 0.01 μm to 0.1 μm) The stop layer 631 is configured as, for example, a layer of silicon oxide, silicon nitride, or silicon oxynitride. In some embodiments, the stop layer 631 serves as a layer for protecting the first nitride layer 620 from damages during an etching process. A second nitride layer 622 is formed over the stop layer 631. (thickness range from 0.05 μm to 0.2 μm) In some embodiments, the second nitride layer 622 includes silicon nitride. The second nitride layer 622 serves as a sacrificial layer. In some embodiments, an anti-reflection coating (ARC) layer 641 is chosen to be disposed on the second nitride layer 622. A photoresist layer 642 is then deposited and patterned over the ARC layer 641 to define positions of isolations. Openings in the photoresist layer 642 are the positions whereby forming trenches.

In some embodiments, the photoresist layer 642 is patterned to include a first region 654 and a second region 655. The first region 654 is configured for disposing an imaging pixel array having a plurality of imaging pixels configured to capture image data. The second region 655 is configured for disposing a periphery circuitry having transistors configured to receive and process the image data.

A first etching process is introduced therein and arrows labeled with 701 are indicating ion streams. In some embodiments as in FIG. 5A, the first etching process 701 utilizes a dry etching process, for example a reactive ion etch (RIE). Bromine-based plasma or fluorine-based plasma is used in the dry etching. In some other embodiments, the first etching process 701 includes dry and wet etch.

Figure 5B:
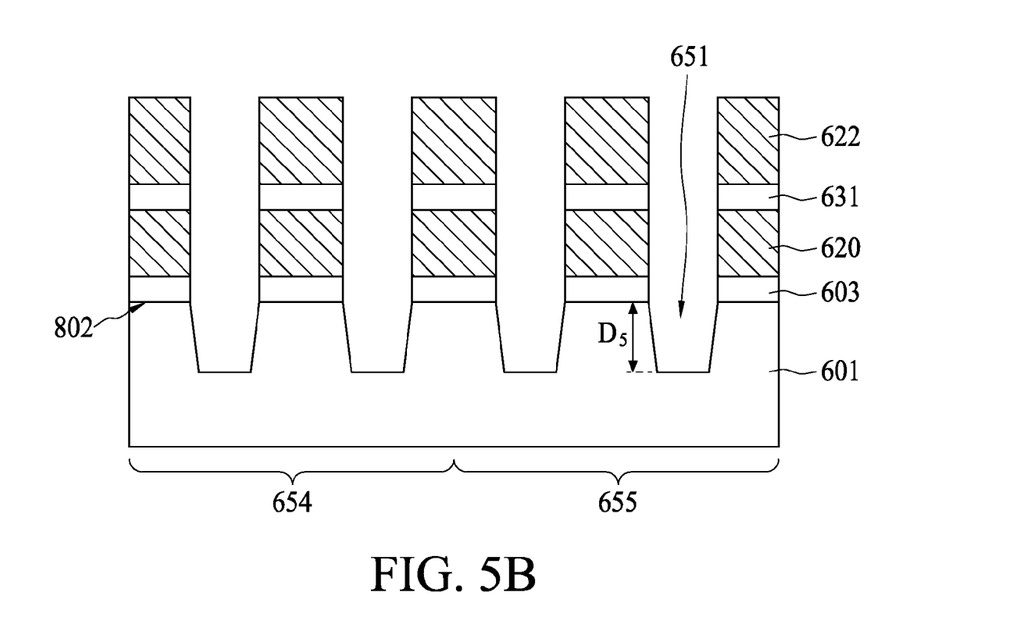

As shown in FIG. 5B, a portion of films stacking on the substrate 601 are removed and further forming trenches 651 in the substrate 601. Distribution of the trenches 651 substantially follows the pattern of the photoresist layer 642 (removed in a subsequent operation). Each trench 651 has a fifth depth D5 measured from a surface 802 of the substrate 601. Since different depths of trenches are required between the first region 654 and the second region 655, a second etching process for deeper trenches is needed.

Figure 5C:
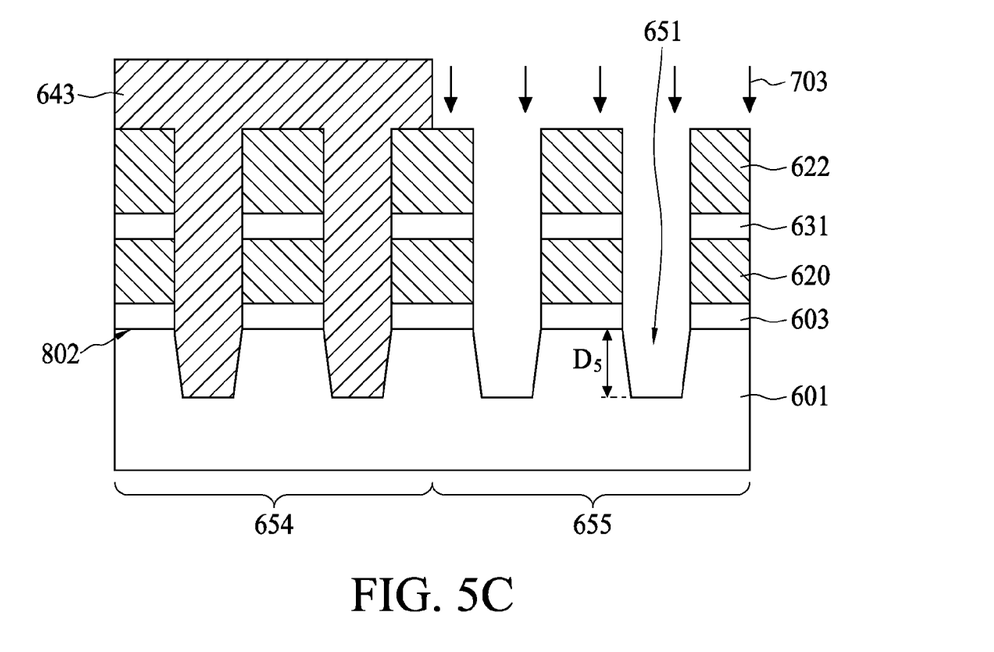

Because the imaging pixel array and periphery are designed to have different trench width. A second etching process is introduced therein and arrows labeled with 703 are indicating ion streams. The second etching process 703 is further introduced to differentiate the first region 654 and the second region 655. Referring to FIG. 5C, a photoresist layer 643 is coated and patterned. In this stage, the trenches 651 in the first region 654 are filled with the photoresist layer 643. The first region 654 is also substantially covered by the photoresist layer 643. On the contrary, the trenches 651 in the second region 655 are empty without the photoresist layer 643 filled in. In some embodiments as in FIG. 5C, the second etching process 703 utilizes a dry etching process, for example a reactive ion etch (RIE). Bromine-based plasma or fluorine-based plasma is used in the dry etching. In some other embodiments, the first etching process includes dry and wet etch.

Figure 5D:
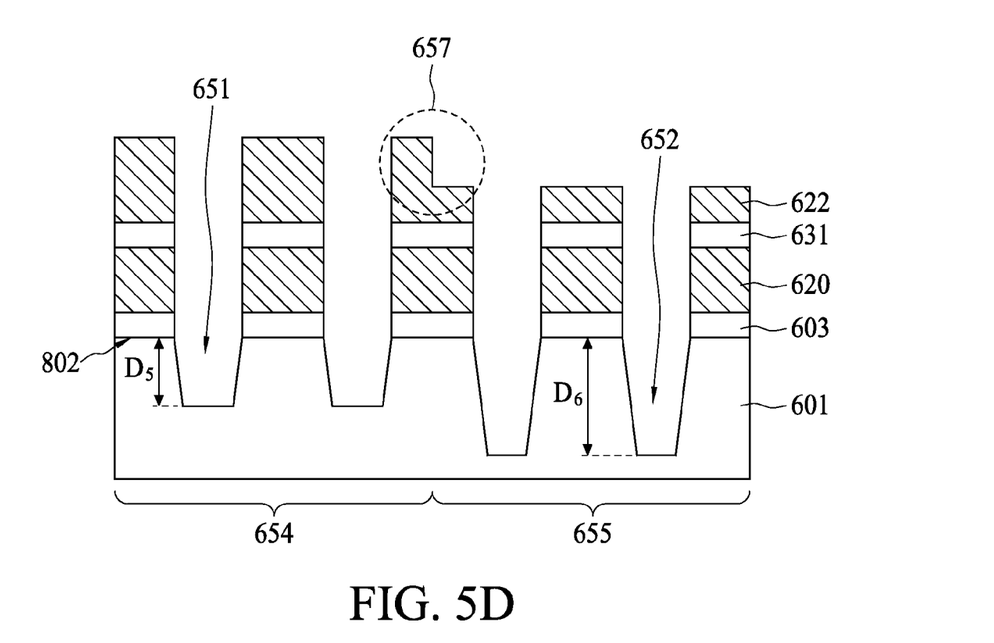

Referring to FIG. 5D, the second region 655 is further etched to form trenches 652 with a sixth depth D6 measured from the surface 802 of substrate 601. The sixth depth D6 is deeper than the fifth depth D5. For some film stacks located at a boarder between the first region 654 and second region 655, a step 657 is formed on the second nitride layer 622 because a portion of the second nitride 622 is not covered by the photoresist 643 with reference to FIG. 5C. The step height 657 has a lower portion in the second region 655.

Figure 5E:
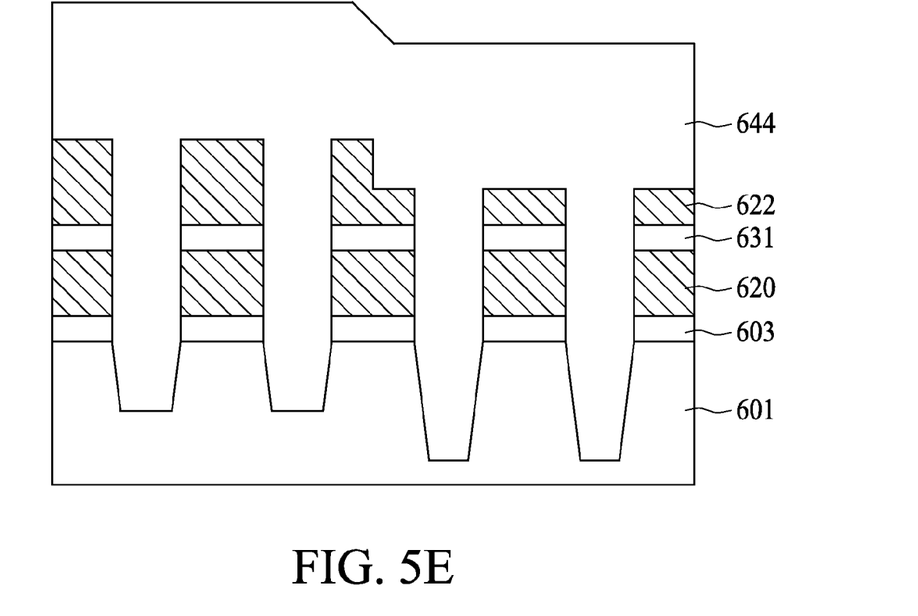
Figure 5F:
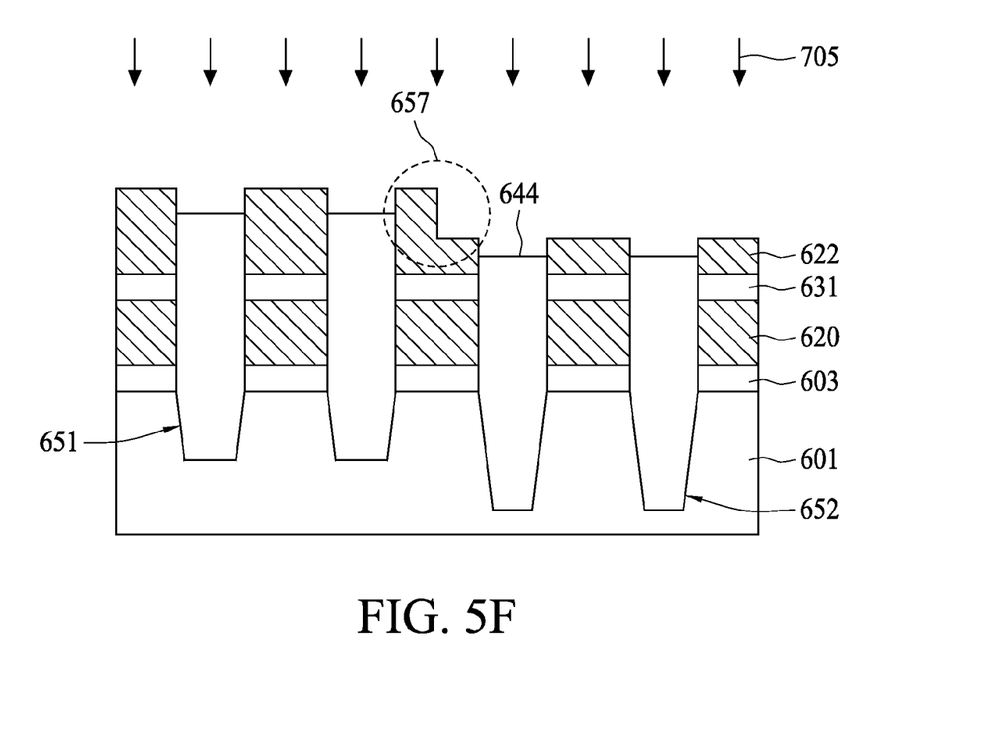

The method continues to a stage as illustrated in FIGS. 5E and 5F. A photoresist layer 644 is coated on the second nitride layer 622 and fills in the trenches 651 and trenches 652. In FIG. 5F, a photoresist etching 705 is performed to recess the photoresist layer 644. A blanket etching is introduced a portion of the photoresist layer 644. Arrows labeled with 705 are indicating ion streams. In some embodiments as in FIG. 5F, the photoresist etching 705 utilizes a dry etching process, for example, a reactive ion etch (RIE). Bromine-based plasma or fluorine-based plasma is used in the dry etching. In some other embodiments, the photoresist etching 705 includes dry and wet etch. The photoresist layer 644 also serves as a protection to prevent trench 652 from being damaged during the blanket etching. In some embodiments, the blanket etching uses endpoint mode to detect when the second nitride layer 622 is exposed. If optical signals of the photoresist composition, such as carbon, dramatically decrease, the second nitride layer 622 is exposed. The blanket etching transits to an over etch step to ensure the second nitride layer 622 is exposed. Meanwhile, some photoresist 644 in the trenches 651 and 652 are also removed as in FIG. 5F.

Figure 5G:
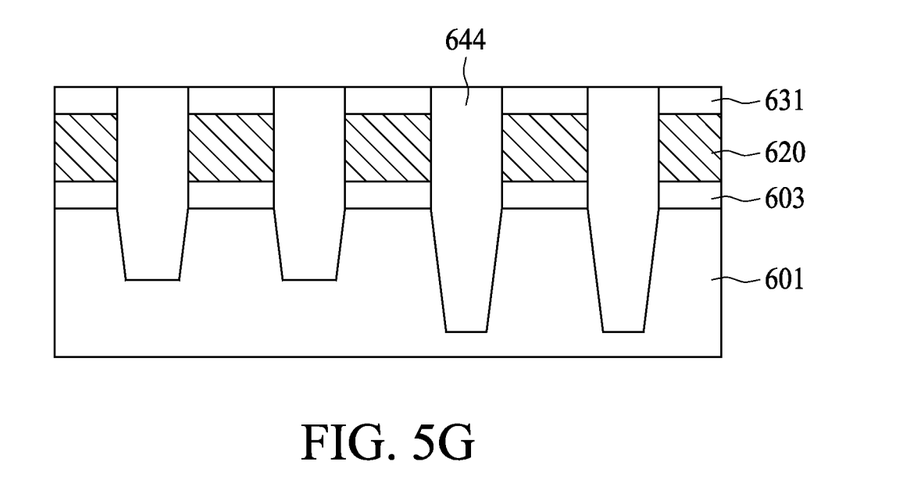

The method continues to a stage as illustrated in FIG. 5G. The second nitride layer 622 in FIG. 5F is stripped; for example, by a wet etching using hot phosphoric acid solution. Because the second nitride layer 622 is removed before continuing on subsequence operations, the step height 657 on the second nitride layer 622 in FIG. 5F does not exist and will not become a topographic factor affecting the subsequent operations. In some embodiments as in FIG. 5G, a planarization operation is introduced so as to have a flat top surface provided by the photoresist layer 644 and the stop layer 631. Thus, in some embodiments, the second nitride layer 622 is also called as a sacrificial layer for aiding the subsequent operations.

Figure 5H:
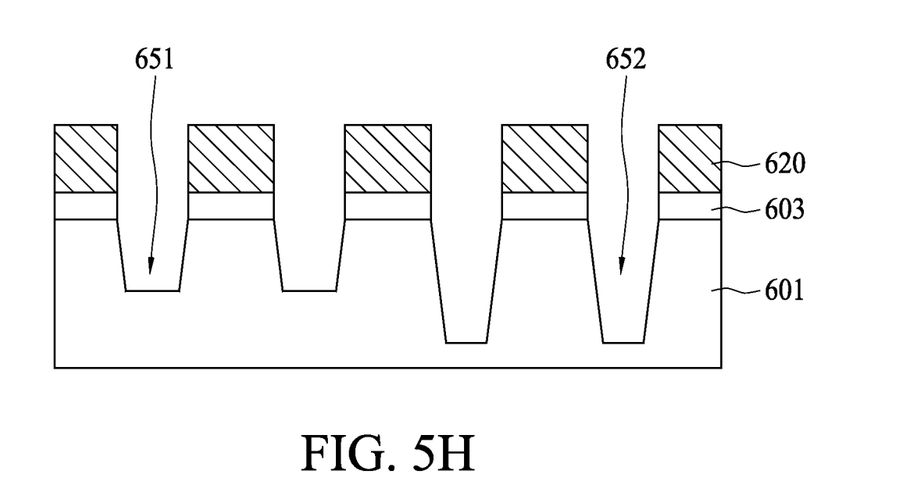

The method continues to a stage as illustrated in FIG. 5H. The photoresist layer 644 inside the trenches 651 and 652 is removed. The stop layer 631 is also removed by a separate process from the photoresist removal. In some embodiments, the separate process includes, for example, a wet etch with selectivity chemistry such as hydrogen fluoride. Top surface of the first nitride layer 620 is exposed.

Figure 5I:
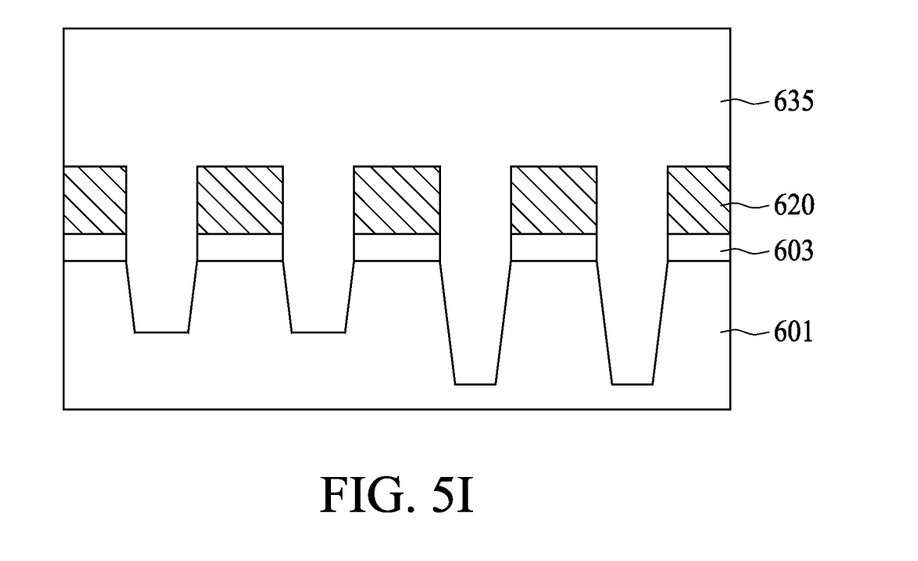

A dielectric layer 635 is deposited as in FIG. 5I. The dielectric layer 635 is over the first nitride layer 620 and fills in the trenches 651 and 652 as well. In some embodiments, the dielectric layer 635 includes silicon oxide. In some embodiments, the dielectric layer 635 is deposited by a CVD process.

Figure 5J:
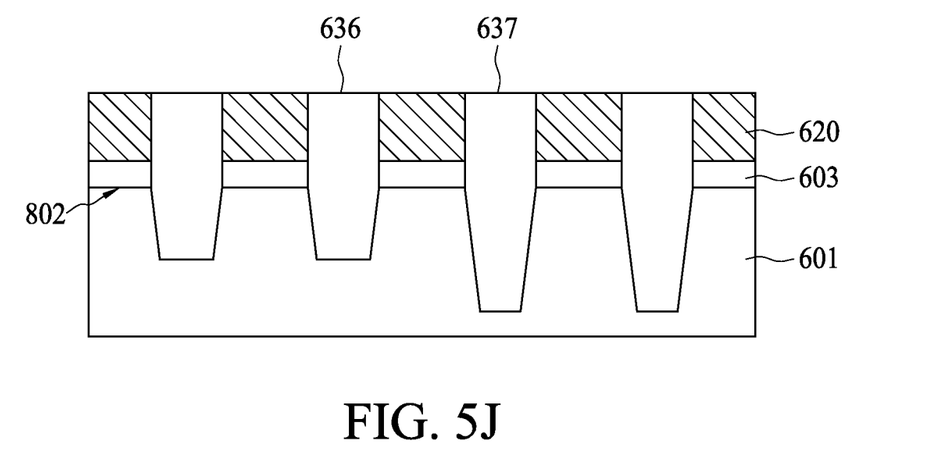

In FIG. 5J, a chemical-mechanical polishing (CMP) operation is performed for removing a portion of the dielectric layer 635 in order to form a planar top surface 801 on the dielectric layer 635. A portion of the first nitride layer 620 is also removed with material of the dielectric layer 635 as well. The first nitride layer 620 is finally exposed at the present stage. A final profile after the CMP operation is to form the isolations 636 and 637 in the substrate 601.

Figure 5K:
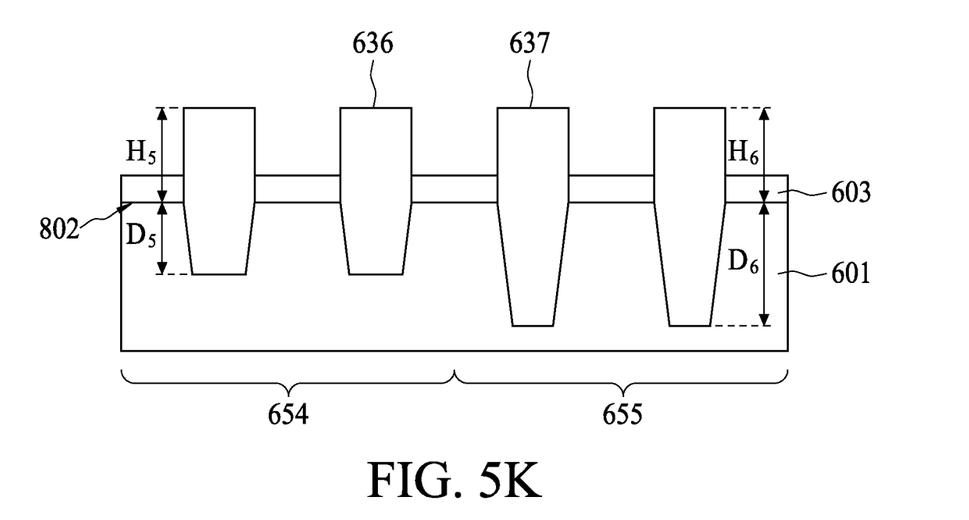

In FIG. 5K, the first nitride layer 620 is stripped, for example, by a hot phosphoric acid solution. With regard to each isolation 636 or each isolation 637, a portion of the isolation is inside the substrate 601. Another portion of the isolation projects from the surface 802 of the substrate 601 to form a protrusion. An isolation 636 in the first region 654 has the fifth depth D5 and a fifth protrusion height H5 projected from the surface 802. Similarly, an isolation 637 in the second region 655 has the sixth depth D6 and a sixth protrusion height H6 projected from the surface 802.

FIGS. 6A-6D represent a method of manufacturing a semiconductor structure as in FIG. 4 in accordance with some embodiments of the present disclosure. Each figure represents a stage of the method in a cross sectional perspective view.

According to some embodiments, an advantage of the present disclosure is to eliminate a micro loading effect during the following process.

Figure 6A:
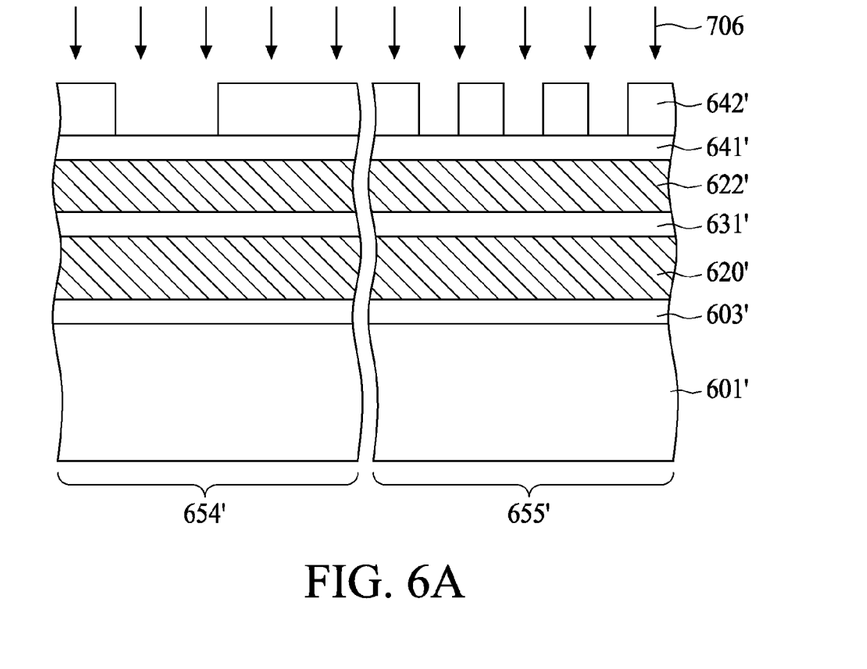
FIGS. 6A-6D represent a method of manufacturing a semiconductor structure as in FIG. 4 in accordance with some embodiments of the present disclosure.

Referring to FIG. 6A, a pad layer 603' is formed over a substrate 601'. A first nitride layer 620' is formed over the pad layer 603' by deposition. A stop layer 631' is formed over the first nitride layer 620'. A second nitride layer 622' is formed over the stop layer 631'. The second nitride layer 622' serves as a sacrificial layer. In some embodiments, an anti-reflection coating (ARC) layer 641' is chosen to be disposed on the second nitride layer 622'. A photoresist layer 642' is then deposited and patterned over the ARC layer 641' to define positions of isolations. Openings in the photoresist layer 642' are the positions whereby forming trenches.

In some embodiments, the photoresist layer 642' is patterned to include a first region 654' and a second region 655'. The first region 654' of the substrate 601' has a first isolation pattern density, which is lower than a second isolation pattern density of the second region 655'.

A first etching process is introduced therein and arrows labeled with 706 are indicating ion streams. Detail of etching process is referred to embodiments corresponding to FIG. 5A.

Figure 6B:
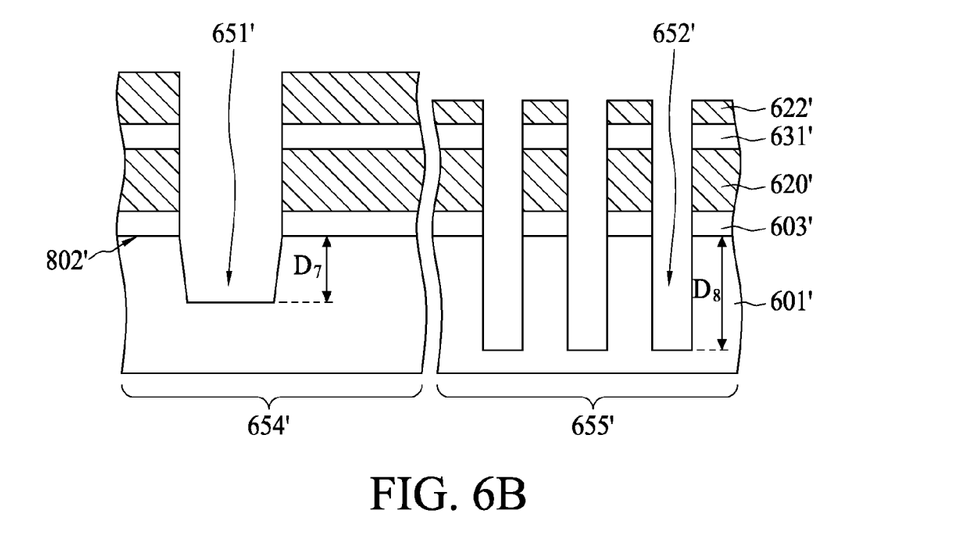

As shown in FIG. 6B, a portion of films stacking on the substrate 601' is removed and further forming trenches 651' and 652' in the substrate 601'. Distribution of the trenches 651' and 652' substantially follows the pattern of the photoresist layer 642' (removed in a subsequent operation). Each trench 651' in the first region 654' has a seventh depth D7 measured from a surface 802' of the substrate 601'. The second region 655' is etched to form the trenches 652' with an eighth depth D8 measured from the surface 802' of substrate 601'. The eighth depth D8 is deeper than the seventh depth D7 because of a micro loading effect. A thickness difference of the second nitride layer 622' is also induced between the first region 654' and the second region 655'.

Figure 6C:
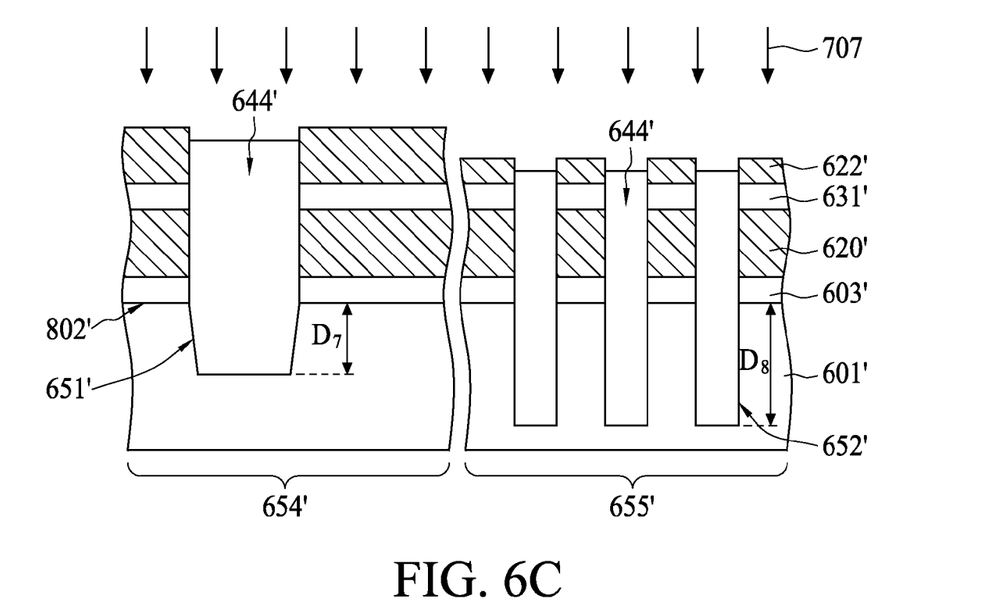

The method continues to a stage as illustrated in FIG. 6C. A photoresist layer 644' is coated on the second nitride layer 622' and fills in the trenches 651' and 652'. A blanket etching is introduced to remove a portion of the photoresist layer so as to make the photoresist layer 644' recessed under the top surface of second nitride layer 622'. Arrows labeled with 707 are indicating ion streams. In some other embodiments, the first etching process includes dry and wet etch. The photoresist layer 644' also serves as a protection to prevent trench 652' from being damaged during the blanket etching. Other detail of the present operation is referred to description corresponding to FIG. 5F.

Figure 6D:
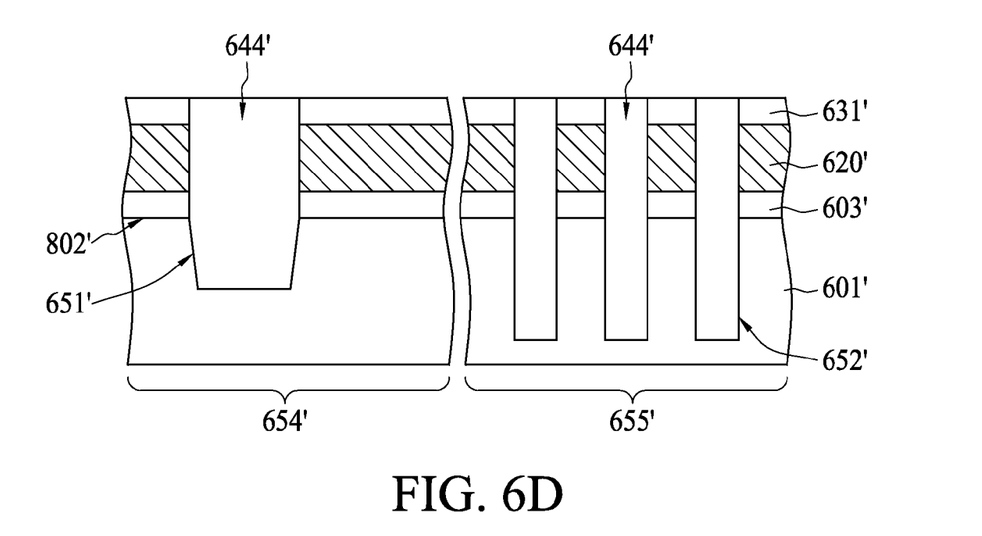

The method continues to a stage as illustrated in FIG. 6D. A portion of photoresist 644' in the trenches 651' and 652' are also removed. The second nitride layer 622' is stripped; for example, by a wet etching using hot phosphoric acid solution. Because the second nitride layer 622' is removed before continuing on subsequence operations, the thickness difference of the second nitride layer 622' does not exist and will not become a topographic factor affecting the subsequent operations.

Several operations subsequent to FIG. 6D are identical to the operations illustrated from FIGS. 5H to 5K. These operations are skipped herein for simplicity. A structure fabricated by the method is referred to the embodiments as illustrated in FIG. 4.

In some embodiments, a semiconductor structure includes a substrate, an imaging pixel array disposed on a first region of the substrate, a first isolation disposed in the first region, a periphery circuitry disposed on a second region of the substrate, and a second isolation disposed in the second region. The imaging pixel array has a plurality of imaging pixels configured to capture image data. The periphery circuitry has a transistor configured to receive and process the image data. The first isolation has a first depth and a first protrusion projected from a surface of the substrate. The second isolation has a second depth and a second protrusion projected from the surface of the substrate. The first protrusion has a substantially same height as the second protrusion. The first depth is different from the second depth.

In some embodiments, the semiconductor structure has a difference between the first depth and the second depth is between about 0.05 μm and 0.4 μm In some embodiments, the semiconductor structure has a difference between a height of the first protrusion and a height of the second protrusion is between 300 angstrom and 400 angstrom.

In some embodiments, the semiconductor structure further includes a third isolation in the first region with a third depth and a third protrusion projected from the surface of the substrate. The third protrusion has substantially the same height as the first protrusion.

In some embodiments, the third depth is different from the first depth.

In some embodiments, the semiconductor structure further includes a fourth isolation in the second region with a fourth depth and a fourth protrusion projected from the surface of the substrate. The forth protrusion has substantially the same height as the second protrusion.

In some embodiments, the fourth depth is different from the second depth.

In some embodiments, a semiconductor structure includes a substrate, a first region of the substrate having a first isolation pattern density, a first isolation disposed in the first region, a second region of the substrate having a second isolation pattern density, and a second isolation disposed in the second region. The first isolation has a first depth and a first protrusion projected from a surface of the substrate. The second isolation has a second depth and a second protrusion projected from the surface of the substrate. The first protrusion has a substantially same height as the second protrusion. The first depth is different from the second depth. The second isolation pattern density is higher than the first isolation pattern density.

In some embodiments, a difference between the first depth and the second depth is between about 0.05 μm and 0.4 μm.

In some embodiments, a difference between a height of the first protrusion height and a height of the second protrusion height is between about 300 angstrom and 400 angstrom.

In some embodiments, the semiconductor structure further includes a third isolation in the first region with a third depth and a third protrusion projected from the surface of the substrate. The third protrusion has substantially the same height as the first protrusion. The third depth is different from the first depth.

In some embodiments, the semiconductor structure further includes a fourth isolation in the second region with a fourth depth and a fourth protrusion projected from the surface of the substrate. The forth protrusion has substantially the same height as the second protrusion. The fourth depth is different from the second depth.

In some embodiments, a method for forming a semiconductor structure includes forming a first nitride layer on a substrate, forming a stop layer on the first nitride layer, forming a second nitride layer on the stop layer, forming a plurality of first trenches in the substrate with a first depth, forming a plurality of second trenches in the substrate with a second depth, forming a photoresist layer inside the plurality of first trenches, the plurality of second trenches, and on the second nitride layer, removing the photoresist layer thereby exposing the second nitride layer, and removing the second nitride layer.

In some embodiments, the first depth is different from the second depth.

In some embodiments, the first depth is formed in a first region of the substrate. The first region is configured for disposing an imaging pixel array having a plurality of imaging pixels configured to capture image data.

In some embodiments, the second depth is formed in a second region of the substrate. The second region is configured for disposing a periphery circuitry having a transistor configured to receive and process the image data.

In some embodiments, the first depth is formed in a first region of the substrate having a first isolation pattern density.

In some embodiments, the second depth is formed in a second region of the substrate having a second isolation pattern density. The second isolation pattern density is higher than the first isolation pattern density.

In some embodiments, the method further includes removing the stop layer and the photoresist layer inside the plurality of first trenches, the plurality of second trenches.

In some embodiments, the method further includes forming a dielectric layer inside the plurality of first trenches, the plurality of second trenches, and on the first nitride layer.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method for forming a semiconductor structure, comprising:

forming a first nitride layer on a substrate;

forming a stop layer on the first nitride layer;

forming a second nitride layer on the stop layer;

forming a plurality of first trenches in the substrate with a first depth;

forming a plurality of second trenches in the substrate with a second depth;

forming a photoresist layer inside the plurality of first trenches, the plurality of second trenches, and on the second nitride layer;

removing the photoresist layer thereby exposing the second nitride layer; and removing the second nitride layer.

2. The method of claim 1, wherein the first depth is different from the second depth.

3. The method of claim 1, wherein the first depth is formed in a first region of the substrate, the first region is configured for disposing an imaging pixel array having a plurality of imaging pixels configured to capture image data.

4. The method of claim 1, wherein the second depth is formed in a second region of the substrate, the second region is configured for disposing a periphery circuitry having a transistor configured to receive and process the image data.

5. The method of claim 1, wherein the first depth is formed in a first region of the substrate having a first isolation pattern density.

6. The method of claim 5, wherein the second depth is formed in a second region of the substrate having a second isolation pattern density, the second isolation pattern density is higher than the first isolation pattern density.

7. The method of claim 1 further comprising removing the stop layer and the photoresist layer inside the plurality of first trenches, the plurality of second trenches.

8. The method of claim 1 further comprising forming a dielectric layer inside the plurality of first trenches, the plurality of second trenches, and on the first nitride layer.

9. The method of claim 1, wherein the plurality of first trenches in the substrate with the first depth and the plurality of second trenches in the substrate with the second depth are formed concurrently, and the first depth is different from the second depth.

10. The method of claim 1, wherein the forming the second nitride layer comprises forming a nitride layer with a thickness of from about 0.05 µm to about 0.2 µm.

11. The method of claim 9, wherein the first trenches with the first depth are formed in a lower pattern density region and the second trenches with the second depth are formed in a higher pattern density region.

12. The method of claim 9, wherein the first trenches with the first depth are formed in a pixel region and the second trenches with the second depth are formed in a periphery circuit region.

* * * * *